( 12 ) United States Patent
Kim et al.

(10) Patent No.: US 10,943,560 B2
(45) Date of Patent: Mar. 9, 2021

(54) CLOCK RECOVERY DEVICE AND SOURCE DRIVER FOR RECOVERING EMBEDDED CLOCK FROM INTERFACE SIGNAL

(71) Applicant: SILICON WORKS CO., LTD., Daejeon (KR)

(72) Inventors: Byung-Guk Kim, Daejeon (KR); Hyun Kyu Jeon, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 0 days.

(21) Appl. No.: 16/505,047

(22) Filed: Jul. 8, 2019

(65) Prior Publication Data

US 2020/0013370 A1   Jan. 9, 2020

(30) Foreign Application Priority Data

Jul. 9, 2018 (KR) .................. 10-2018-0079641

(51) Int. Cl.
*G09G 5/00* (2006.01)
*H03L 7/085* (2006.01)

(52) U.S. Cl.
CPC ..... *G09G 5/008* (2013.01); *G09G 2310/0275* (2013.01); *H03L 7/085* (2013.01)

(58) Field of Classification Search
CPC ....... G09G 2310/0275; G09G 2330/06; G09G 2370/08; G09G 3/3275; G09G 3/3688; G09G 5/008; H03L 7/085
USPC .................................................. 345/76, 204
See application file for complete search history.

(56) References Cited

U.S. PATENT DOCUMENTS

| | | | | |
|---|---|---|---|---|
| 6,549,598 | B1 * | 4/2003 | Kumaki | H03D 13/003 370/229 |
| 8,565,362 | B2 | 10/2013 | Kim | |
| 9,361,825 | B2 * | 6/2016 | Jeong | G09G 3/2096 |
| 10,727,839 | B2 * | 7/2020 | Kim | G09G 5/008 |
| 2003/0014724 | A1 * | 1/2003 | Kojima | G06F 30/30 716/113 |
| 2003/0184677 | A1 * | 10/2003 | Kuzumoto | H04N 7/035 348/465 |
| 2005/0105607 | A1 * | 5/2005 | Mochizuki | H03K 5/1252 375/239 |
| 2006/0188048 | A1 * | 8/2006 | Suzuki | H04L 25/4904 375/361 |
| 2008/0180155 | A1 * | 7/2008 | Lee | G06F 1/04 327/295 |
| 2009/0079719 | A1 * | 3/2009 | Lee | H03L 7/0891 345/204 |
| 2009/0129789 | A1 * | 5/2009 | Hanawa | G02B 6/2932 398/214 |
| 2010/0027720 | A1 * | 2/2010 | Akahori | H04L 25/022 375/340 |

(Continued)

FOREIGN PATENT DOCUMENTS

| | | | |
|---|---|---|---|
| JP | 2014-062972 A | 4/2014 | |
| KR | 10-2009-0073473 A | 7/2009 | |
| KR | 10-1930532 B1 | 12/2018 | |

*Primary Examiner* — Tony O Davis
(74) *Attorney, Agent, or Firm* — Fenwick & West LLP

(57) ABSTRACT

In generating a mask signal to be used when a clock signal embedded in an interface signal is recovered, when a mask rising signal for generating the mask signal is located in a data signal interval and a data signal indicates a high level, the mask signal may be generated in accordance with a falling edge of the data signal other than the mask rising signal.

11 Claims, 15 Drawing Sheets

(56) References Cited

U.S. PATENT DOCUMENTS

| | | | |
|---|---|---|---|
| 2010/0293405 A1* | 11/2010 | Shen | G06F 1/08 |
| | | | 713/401 |
| 2011/0037758 A1* | 2/2011 | Lim | H03L 7/0805 |
| | | | 345/213 |
| 2011/0286562 A1* | 11/2011 | Jeon | H03L 7/0807 |
| | | | 375/371 |
| 2014/0169507 A1* | 6/2014 | Shimada | H04L 7/0331 |
| | | | 375/342 |
| 2015/0163050 A1* | 6/2015 | Han | H04L 7/04 |
| | | | 375/362 |
| 2016/0104418 A1* | 4/2016 | Keum | G09G 3/3208 |
| | | | 345/76 |
| 2018/0173585 A1* | 6/2018 | Moon | G09G 3/20 |
| 2020/0013370 A1* | 1/2020 | Kim | G09G 5/008 |
| 2020/0014391 A1* | 1/2020 | Kim | G09G 5/008 |
| 2020/0145181 A1* | 5/2020 | Kim | H04L 7/044 |

* cited by examiner

CLOCK RECOVERY DEVICE AND SOURCE DRIVER FOR RECOVERING EMBEDDED CLOCK FROM INTERFACE SIGNAL

CROSS REFERENCE TO RELATED APPLICATION

This application claims priority from Republic of Korea Patent Application No. 10-2018-0079641, filed on Jul. 9, 2018, which is hereby incorporated by reference in its entirety.

BACKGROUND

Field of Technology

The embodiment relates to a technique for recovering an embedded clock from an interface signal.

Description of the Prior Art

At least two devices can exchange information through an interface signal.

The interface signal is divided into a plurality of unit times, and a value for a field may be recorded for each unit time. Such a field is also referred to as a bit. When recognizing the interface signal by dividing the interface signal into each unit time, a reception device can read the value of each bit received through the interface signal.

In order to divide the interface signal into each unit time, a clock signal indicating each unit time is required. The clock signal can be transmitted from a transmission device to a reception device together with the interface signal.

The interface signal containing the value of each field can be transmitted and received via a separate line from the clock signal. The reception device may receive the interface signal through a first line, receive the clock signal through a second line, and use the clock signal to recognize the interface signal by dividing the interface signal into each unit time portions, thereby obtaining data from the interface signal.

However, if the interface signal and the clock signal are constituted by separate lines, a problem of electromagnetic interference (EMI) in which a clock signal and an interface signal interfere with each other may occur, a problem of data sampling error may occur due to a difference in transmission delay of each line, and a problem of space allocation may occur due to an increase in the number of lines.

In order to solve the above-mentioned problems, the transmission/reception device can transmit/receive a clock signal embedded in an interface signal. This can alleviate the problem of EMI, the problem of data sampling error, and the problem of space allocation.

In an embedded clock scheme in which a clock signal is embedded in an interface signal, the clock signal may be inserted into some time intervals of the interface signal, and transmitted and received. The reception device can extract the clock signal from the interface signal by using a mask signal indicating the time interval into which the clock signal is inserted.

A mask signal generation circuit may generate a mask signal to indicate a time interval containing a portion into which the clock signal is inserted. However, when the mask signal generation circuit generates the mask signal, there may arise a problem that the time interval of the portion into which the clock signal is inserted cannot be accurately indicated due to a processing delay time of a logic circuit. For example, the clock signal may not be included in the time interval indicated by the mask signal in the interface signal, or a data signal or a dummy signal may be included in the corresponding time interval. In this case, the reception device cannot recover the clock signal from the interface signal, or the transmission device may generate a clock signal having a characteristic different from that of the intended clock signal.

SUMMARY

Given this background, an aspect of the present disclosure is to provide a technique for accurately recovering a clock signal from an interface signal.

In accordance with an aspect of the present disclosure, a clock recovery device includes: a mask signal generation unit configured to form a rising edge of a mask signal in accordance with a mask rising signal when an interface signal indicates a first level at a time point when a signal level of the mask rising signal transits, and to form the rising edge of the mask signal in accordance with a section where the interface signal transits from a second level to the first level when the interface signal indicates the second level different from the first level at the time point when the signal level of the mask rising signal transits; a clock extraction unit configured to generate an extraction clock from the interface signal with a clock signal embedded therein in a time interval in which the mask signal is activated; and a time-delay control unit configured to generate a plurality of data clock signals and the mask rising signal in a next period by time-delaying the extraction clock.

One period of the interface signal may be divided into a plurality of unit times, each including divided information, and a phase of the mask rising signal may be ahead of a phase of the extraction clock by K unit times (K is a positive number and a multiple of 0.5).

The interface signal may include a dummy signal interval and a clock signal interval, and the interface signal may indicate the first level in the dummy signal interval and indicates the second level in the clock signal interval. A phase of the mask rising signal may be ahead of a phase of the dummy signal interval.

The mask signal generation unit may generate a falling edge of the mask signal in accordance with the extraction clock or a signal obtained by delaying the extraction clock for a predetermined time.

The time-delay control unit may include a delay circuit configured to generate a plurality of data clock signals respectively having different phases by time-delaying the extraction clock through a plurality of delay means connected in serial and to adjust a degree of time delay of each delay means in accordance with a voltage control signal, and a phase difference feedback unit configured to generate the voltage control signal corresponding to a phase difference between one data clock signal and another data clock signal obtained by the one data clock signal passing a predetermined number of delay means to output the generated voltage control signal to each delay means. One period of the interface signal may be divided into a plurality of unit times, each including divided information, and the delay means may delay the time by 0.5 unit times.

In accordance with another aspect of the present disclosure, a clock recovery device includes: a clock extraction unit configured to generate an extraction clock from an interface signal with a clock signal embedded therein in a time interval in which a mask signal is activated; a mask signal generation unit configured to form a rising edge of the mask signal in accordance with a mask rising signal and to form a falling edge of the mask signal in accordance with the extraction clock or a signal obtained by delaying the extraction clock for a predetermined time; and a time-delay control unit configured to generate a plurality of data clock signals and the mask rising signal in a next period by time-delaying the extraction clock.

A time delay may occur between the mask rising signal and the rising edge of the mask signal and between the extraction clock and the falling edge of the mask signal.

In accordance with another aspect of the present disclosure, a source driver includes: a signal reception unit configured to receive a display signal with a clock signal embedded therein; a clock recovery unit configured to generate a plurality of data clock signals by recovering the clock signal from the display signal; and a data driving unit configured to extract image data from the display signal in accordance with the plurality of data clock signals and to drive pixels disposed on a panel in accordance with the image data. The clock recovery unit may generate an extraction clock from the display signal in a time interval in which a mask signal is activated and may generate the plurality of data clock signals and the mask signal using the extraction clock, and a phase of the mask signal may be controlled in accordance with a level of a last data bit in a signal interval of the display signal.

As described above, according to embodiments, the clock signal can be accurately recovered from the interface signal. As an example, according to embodiments, it is possible to accurately recover the clock signal from the interface signal by allowing a mask signal to accurately indicate a portion into which the clock signal is inserted in the interface signal with the clock signal embedded therein. As another example, according to the embodiments, it is possible to generate a mask signal by compensating for a processing delay time generated in the mask signal generation circuit, thereby reducing the inaccuracy of the mask signal due to the processing delay time. As another example, according to the embodiments, it is possible to solve a problem that the clock signal is erroneously recovered due to the data signal appearing in the time interval indicated by the mask signal. As another example, according to the embodiments, it is possible to solve a problem that the clock signal is not recovered because the clock signal is not included in the time interval indicated by the mask signal.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
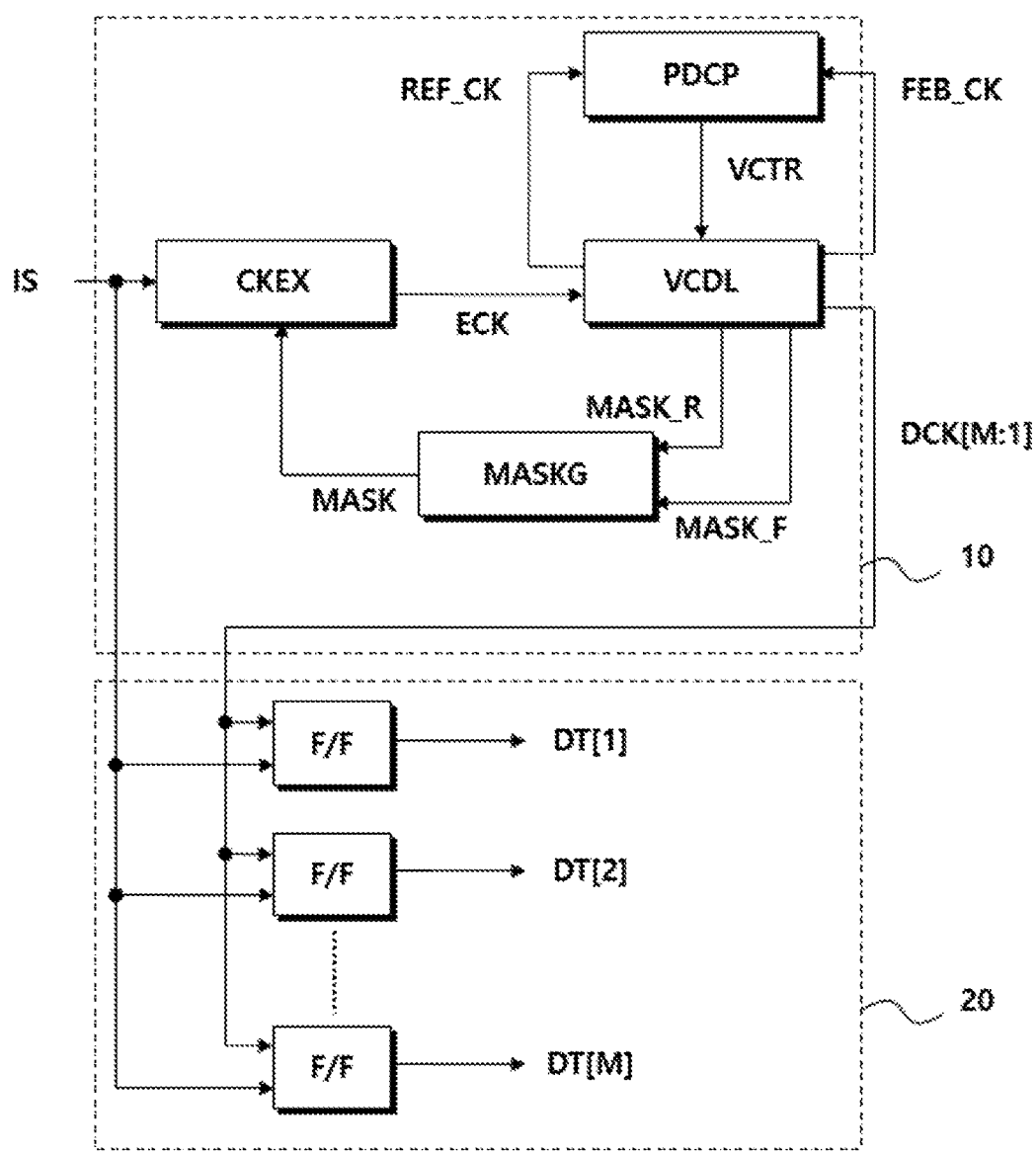
FIG. 1 is a configuration diagram illustrating a general data reception device.

Hereinafter, embodiments of the present disclosure will be described in detail with reference to the accompanying drawings. In adding reference numerals to elements in each drawing, the same elements will be designated by the same reference numerals as far as possible, although they are shown in different drawings. Further, in the following description of the present disclosure, a detailed description of known functions and configurations incorporated herein will be omitted when it is determined that the description may make the subject matter of the present disclosure rather unclear.

In addition, terms, such as first, second, A, B, (a), (b) or the like may be used herein when describing components of the present disclosure. These terms are merely used to distinguish one structural element from other structural elements, and a property, an order, a sequence or the like of a corresponding structural element are not limited by the term. When it is described in the specification that one component is "connected," "coupled" or "joined" to another component, it should be read that the first component may be directly connected, coupled or joined to the second component, but also a third component may be "connected," "coupled," and "joined" between the first and second components.

FIG. 1 is a configuration diagram illustrating a general data reception device.

Referring to FIG. 1, the data reception device may include a clock recovery unit 10 and a data extraction unit 20.

The clock recovery unit 10 may include a clock extraction unit CKEX, a voltage control delay line unit VCDL, a phase feedback unit PDCP, a mask signal generation unit MASKG, and the like.

The clock extraction unit CKEX may generate an extraction clock ECK through a signal in a time interval indicated by a mask signal MASK in an interface signal IS—in a time interval in which a mask signal is activated, for example, where the signal level is high.

The voltage control delay line unit VCDL may generate a plurality of data clock signals DCK[M:1] by time-delaying the extraction clock ECK. The voltage control delay line unit VCDL may control the time-delaying on the extraction clock ECK so that the phase of one data clock signal of the plurality of data clock signals DCK is synchronized with the phase of another data clock signal.

For example, the voltage control delay line unit VCDL may transmit, to the phase feedback unit PDCP, one data clock signal obtained by time-delaying the extraction clock ECK by one unit time as a feedback clock signal FEB_CK, and may transmit, to the phase feedback unit PDCP, another data clock signal obtained by time-delaying the extraction clock ECK by (N+1) unit times as a reference clock signal REF_CK.

The phase feedback unit PDCP may transmit, to the voltage control delay line unit VCDL, a voltage control signal VCTR corresponding to a phase difference between the above-mentioned one data clock signal and the other data clock signal. The voltage control delay line unit VCDL may adjust a time-delay time of the extraction clock ECK according to the voltage control signal VCTR so that the phase of the above-mentioned one data clock signal can be synchronized with the phase of the other data clock signal. According to this synchronization, the phase difference between the respective data clock signals can be equal to a unit time in which information is divided.

The voltage control delay line unit VCDL may generate a mask rising signal MASK_R and a mask falling signal MASK_F together with the plurality of data clock signals DCK, and may transmit the generated signals to the mask signal generating unit MASKG. Here, the mask rising signal MASK_R may be a signal that is delayed in time by R unit times (R is a value corresponding to an integer multiple of 0.5) from the extraction clock ECK, and the mask falling signal MASK_F may be a signal that is delayed in time by Q (Q is a value corresponding to an integer multiple of 0.5 and larger than R) unit times from the extraction clock ECK.

The mask signal generation unit MASKG may generate a rising edge of the mask signal MASK in accordance with the mask rising signal MASK_R, and may generate a falling edge of the mask signal MASK in accordance with the mask falling signal MASK_F, thereby generating the mask signal MASK.

Meanwhile, when the data clock signal DCK is generated in the clock recovery unit 10, the data extraction unit 20 may use a latch circuit F/F to latch the interface signal IS in accordance with each data clock signal DCK, thereby generating a data signal DT.

Figure 2:
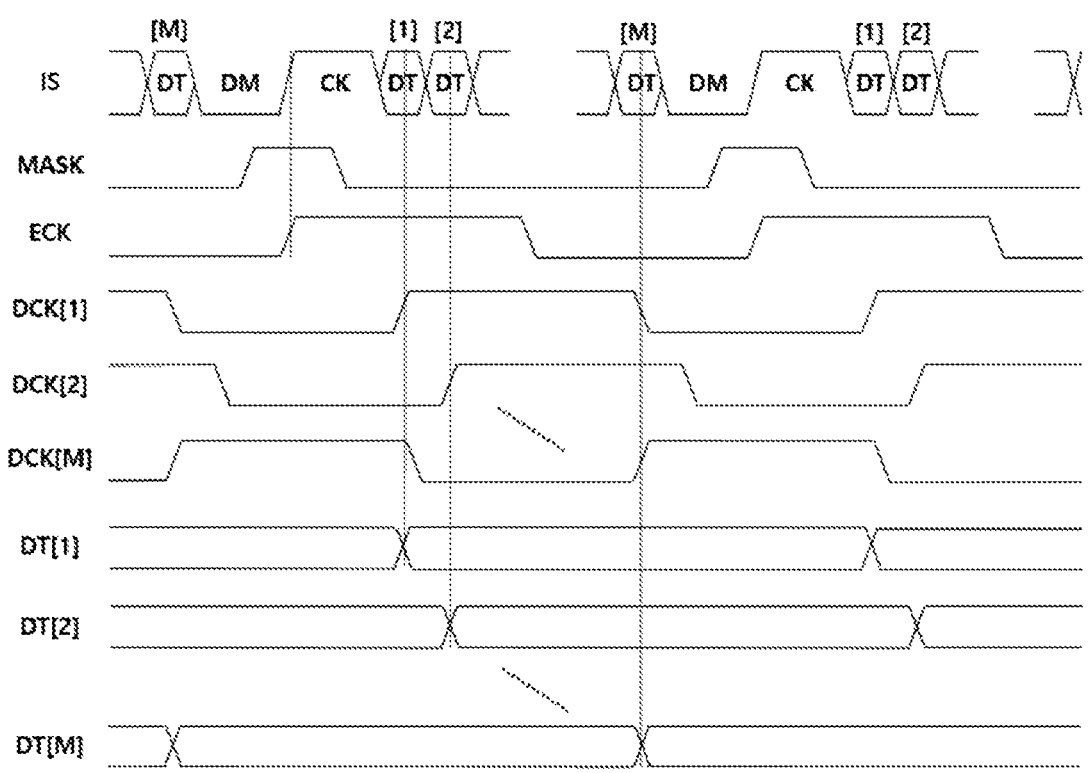
FIG. 2 is a timing diagram illustrating a main signal in the data reception device shown in FIG. 1.

FIG. 2 is a timing diagram illustrating a main signal in the data reception device shown in FIG. 1.

Referring to FIG. 2, a data signal DT, a dummy signal DM, and a clock signal CK may be inserted into an interface signal IS. The respective bits of the data signal DT may be divided into unit times, and one bit of the data signal DT can be inserted in one unit time. The clock signal CK is a portion into which a clock is inserted and may have a size of one unit time or two unit times. The dummy signal DM is a portion other than the data signal DT or the clock signL CK and may be inserted to maintain an interval between the data signal DT and the clock signal CK, or may be inserted as a preliminary section for expansion of the data signal DT.

The mask signal MASK is a signal indicating a time interval in which the clock signal CK is inserted in the interface signal IS, and a clock recovery device may extract a clock signal CK embedded in the interface signal IS from a time interval between the rising edge and falling edge of the mask signal MASK. Meanwhile, the clock signal is a signal repeated with a predetermined period. As shown in FIG. 2, the entire portion CK repeated with a predetermined time interval may be regarded as a clock signal. However, from another viewpoint, the rising edge of this portion CK may be regarded as a clock signal.

The clock extraction unit may detect a level change of the interface signal IS in a time interval in which the mask signal MASK is maintained at a high level, and may generate the extraction clock ECK at a time point when the rising edge or the falling edge appears in the interface signal IS.

The voltage control delay line unit may generate a plurality of data clocks (DCK [M:1], where M is a natural number of 2 or more) by time-delaying the extraction clock ECK.

The data extraction unit may generate a data signal (DT [M:1]) by latching the interface signal IS at the rising edge of each data clock DCK.

Meanwhile, the master signal generation unit may generate the mask signal MASK at a time delayed by a unit time of a predetermined multiple from the extraction clock ECK. When one period of the interface signal IS is divided into N unit times (N is a natural number equal to or greater than 2), the master signal generation unit may generate the mask signal MASK so that the rising edge can be formed at a time point delayed by (N−0.5) unit times from the extraction clock ECK and the falling edge can be formed at a time point delayed by (N+0.5) unit times. This enables the clock extraction unit to detect the clock signal CK of the interface signal IS at the intermediate time point of the time interval during which the mask signal MASK is maintained at the high level.

The rising edge and falling edge of the mask signal MASK are generated by the voltage control delay line unit that time-delays the extraction clock ECK. The voltage control delay line unit may generate a mask rising signal at a time point delayed by (N−0.5) unit times from the extraction clock ECK and may generate a mask falling signal at a time point delayed by (N+0.5) unit times.

The mask signal generation unit may use the mask rising signal and the mask falling signal transmitted from the voltage control delay line unit to generate the mask signal MASK.

Meanwhile, the mask signal generation unit may form the rising edge of the mask signal MASK according to the mask rising signal through an internal circuit, and may form the falling edge of the mask signal MASK according to the mask falling signal. However, since a processing delay time occurs in the internal circuit, the rising edge of the mask signal MASK and the mask rising signal are not synchronized with each other and have a predetermined time difference therebetween, and the falling edge of the mask signal MASK and the mask falling signal are not synchronized with each other and have a predetermined time difference therebetween.

Figure 3:
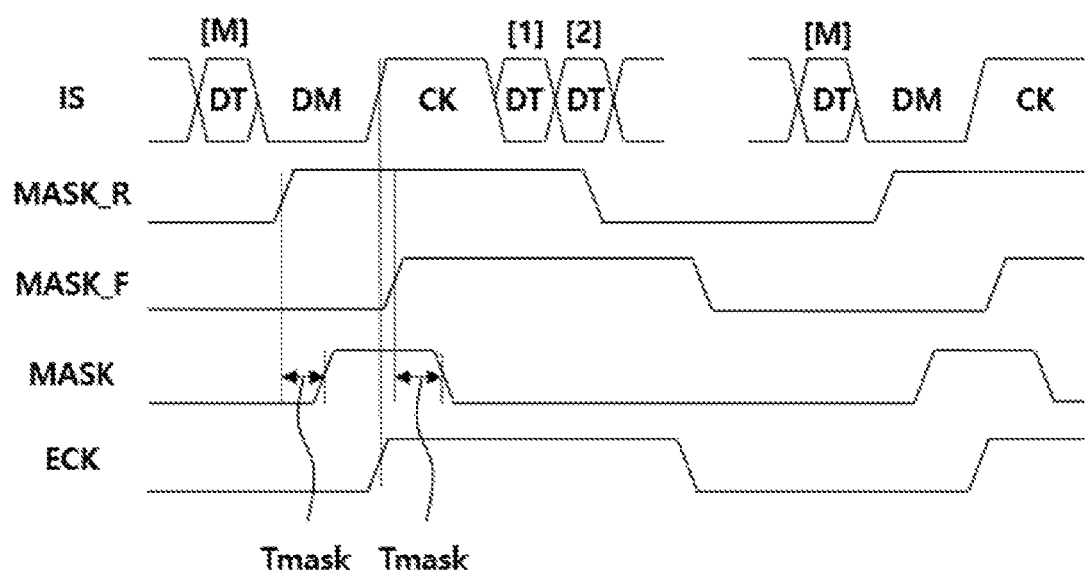
FIG. 3 is a diagram illustrating a time difference between each of a mask rising signal and a mask falling signal with a mask signal.

FIG. 3 is a diagram illustrating a time difference between each of a mask rising signal and a mask falling signal with a mask signal.

Referring to FIG. 3, a processing delay time Tmask between the rising edge of the mask signal MASK and the mask rising signal MASK_R may occur, and the processing delay time Tmask between the falling edge of the mask signal MASK and the mask falling signal MASK_F may occur. Although such a processing delay time Tmask may occur due to the processing delay time of the mask signal generation unit, the processing delay time Tmask may be affected by other factors.

Meanwhile, the mask signal generation unit may generate the mask rising signal MASK_R and the mask falling signal MASK_F in consideration of the above-described processing delay time Tmask in order to detect the clock signal CK in the vicinity of the center of the high level interval of the mask signal MASK.

For example, the mask signal generation unit may generate the mask rising signal MASK_R at a time point (less delayed time point) earlier by the above-described processing delay time Tmask than a time point delayed by (N−0.5) unit times from the extraction clock ECK, and may generate the mask falling signal MASK_F at a time point (less delayed time point) earlier by the above-described processing delay time Tmask than a time point delayed by (N+0.5) unit times. The processing delay time Tmask may be generally set to 0.5 to 1 unit time.

Meanwhile, as a data transfer rate increases recently, the unit time is shortened. As a result, the processing delay time Tmask gradually becomes longer on the basis of the unit time. For example, at a conventional data transfer rate, the processing delay time Tmask may correspond to one unit time. If such a data transfer rate is doubled, the processing delay time Tmask may correspond to two unit times.

In order to reflect the tendency of increasing the data transfer rate, a phase difference between the mask rising signal MASK_R and the extraction clock ECK may be controlled more greatly. For example, if the mask rising signal MASK_R has been conventionally formed earlier by one unit time than the extraction clock ECK, in a recent product with a higher data transfer rate, the mask rising signal MASK_R may be formed earlier by 2 to 3 unit times than the extraction clock ECK.

However, if the phase of the mask rising signal MASK_R is made earlier in this manner, the mask signal MASK is made much earlier so that the mask signal MASK cannot indicate the time interval of the clock signal CK or may indicate the interval of the data signal.

If the time interval indicated by the mask signal MASK indicates the interval of the data signal, there may arise a problem that the clock extraction unit mistakes the data signal as the clock signal CK to erroneously generate the clock. When the mask signal MASK cannot indicate the time interval of the clock signal CK, for example, when the falling edge of the mask signal MASK is ahead of the rising edge of the clock signal CK, the clock extraction unit may not recognize the clock signal CK.

In order to solve these problems, the embodiment of the disclosure provides a technique for preventing the clock extraction unit from misinterpreting the data signal as the clock signal and a technique for preventing the mask signal from failing to indicate the time interval of the clock signal.

Some of the configurations of this embodiment may be the same as those described with reference to FIGS. 1 to 3, and configurations of which functions and details are omitted can be understood with reference to the above description.

Figure 4:
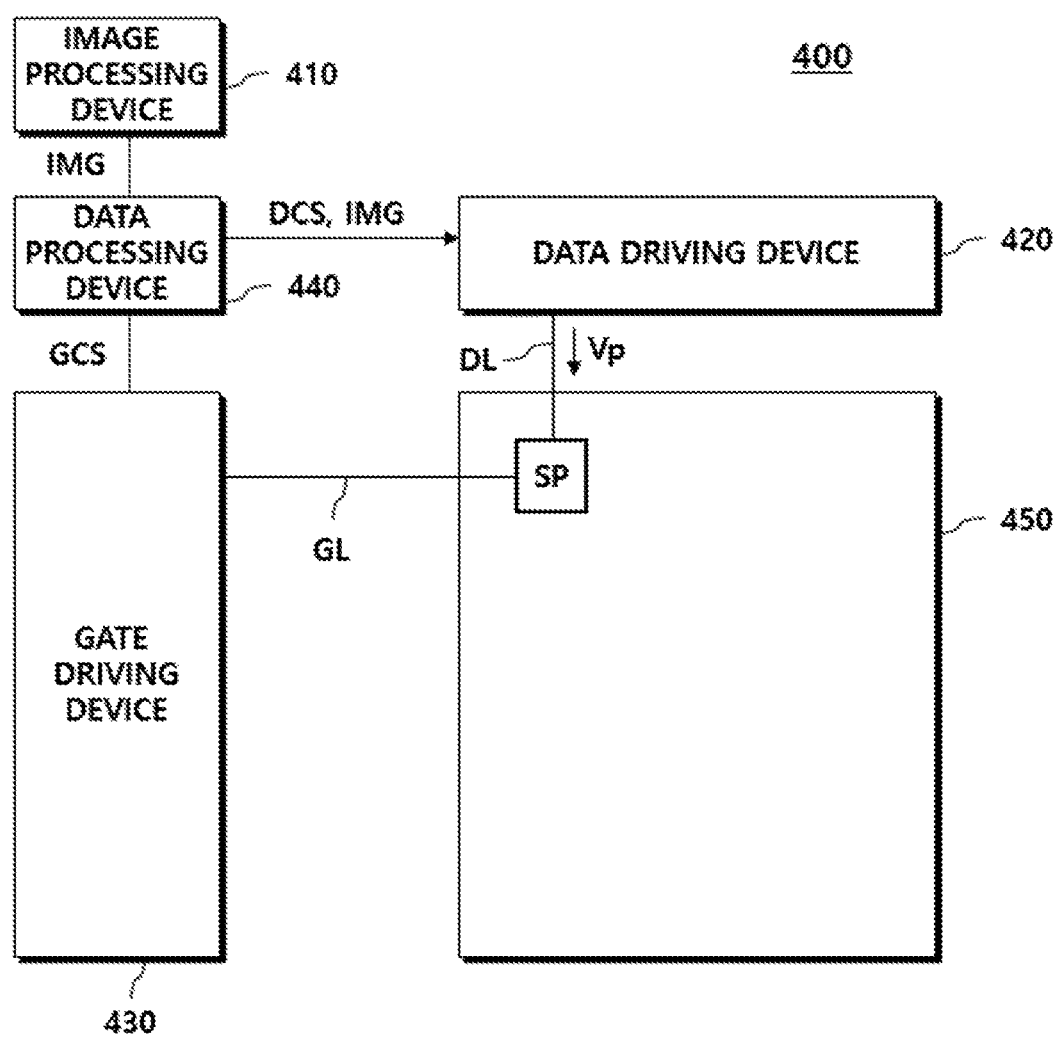
FIG. 4 is a configuration diagram illustrating a display apparatus according to an embodiment.

FIG. 4 is a configuration diagram illustrating a display apparatus according to an embodiment.

Referring to FIG. 4, a display apparatus 400 may include a plurality of panel driving devices 410, 420, 430, and 440 and a display panel 450.

On the display panel 450, a plurality of data lines DL and a plurality of gate lines GL are disposed and a plurality of pixels may be disposed. A pixel may be composed of a plurality of subpixels SP. The subpixels may include R (red), G (green), B (blue), W (white), and the like. One pixel may be composed of subpixels SP of RGB, subpixels SP of RGBG, subpixels SP of RGBW, or the like. Hereinafter, for convenience of description, one pixel is described as being composed of subpixels of RGB.

The panel driving devices 410, 420, 430, and 440 are devices that generate signals for displaying an image on the display panel 450 and may correspond to an image processing device 410, a data driving device 420, a gate driving device 430, and a data processing device 440.

The gate driving device 430 may supply a gate driving signal of a turn-on voltage or a turn-off voltage to the gate line GL. When the gate driving signal of the turn-on voltage is supplied to the subpixel SP, the subpixel SP is connected to the data line DL. When the gate driving signal of the turn-off voltage is supplied to the subpixel SP, the connection between the subpixel SP and the data line DL is released. The gate driving device 430 may be referred to as a gate driver.

The data driving device 420 may supply a data voltage Vp to the subpixel SP through the data line DL. The data voltage Vp supplied to the data line DL may be supplied to the subpixel SP according to the gate driving signal. The data driving device 420 may be referred to as a source driver.

The data processing device 440 may supply a control signal to the gate driving device 430 and the data driving device 420. For example, the data processing device 440 may transmit a gate control signal GCS to the gate driving device 430 to cause a scan to start. The data processing device 440 may output image data IMG to the data driving device 420. The data processing device 440 may transmit a data control signal DCS that controls the data driving device 420 to supply the data voltage Vp to each subpixel SP. The data processing device 440 may be referred to as a timing controller.

The image processing device 410 may generate image data IMG and may transmit the image data IMG to the data processing device 440. The image processing device 410 may be referred to as a host.

Meanwhile, a communication interface is formed between the data processing device 440 and the data driving drive 420, and the data processing device 440 may transmit the data control signal DCS and/or the image data IMG to the data driving device 420.

Figure 5:
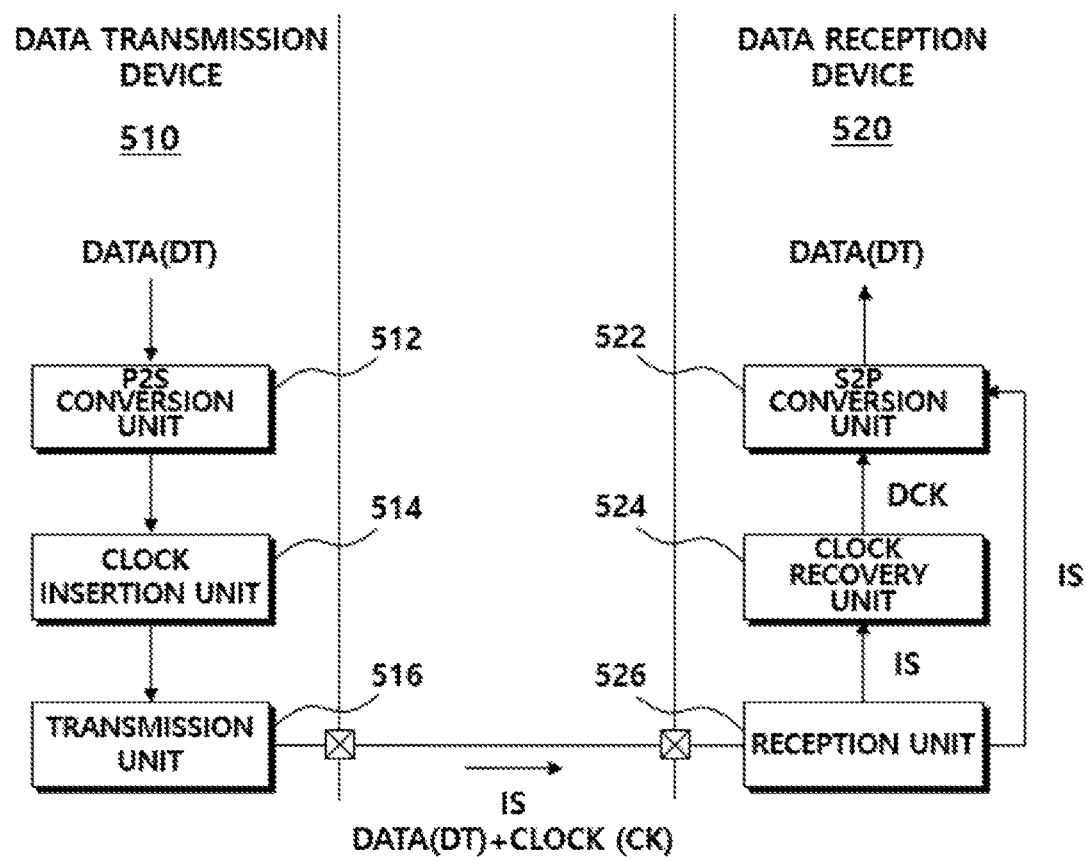
FIG. 5 is a configuration diagram illustrating a data transmission device and a data reception device according to an embodiment.

FIG. 5 is a configuration diagram illustrating a data transmission device and a data reception device according to an embodiment.

A data transmission device 510 shown in FIG. 5 may be included in the one panel driving device described with reference to FIG. 4, and a data reception device 520 may be included in another panel driving device described with reference to FIG. 4.

As an example, the data transmission device 510 may be included in a data processing device (see 440 in FIG. 4) and the data reception device 520 may be included in a data driving device (see 420 in FIG. 4). At this time, the data transmission device 510 can transmit image data or a data control signal as data DT to be transmitted.

As another example, the data transmission device 510 may be included in the data driving device (see 420 in FIG. 4), and the data reception device 520 may be included in the data processing device (see 440 in FIG. 4). At this time, the data transmission device 510 can transmit sensing data for pixels as the data DT to be transmitted.

The data transmission device 510 may include a parallel/serial (P2S) conversion unit 512, a clock insertion unit 514, a transmission unit 516, and the like.

The P2S conversion unit 512 may convert data DT processed by parallel communication into data processed by serial communication. The clock insertion unit 514 may generate an interface signal IS by combining the data DT converted to serial and a clock CK. The transmission unit 516 may transmit the interface signal IS to the data reception device 520 through a signal line.

The data reception device 520 may include a S2P conversion unit 522, a clock recovery unit 524, a reception unit 526, and the like.

The reception unit 526 may receive the interface signal IS through the signal line. The clock recovery unit 524 may recover the clock CK from the interface signal IS, may generate a data clock signal DCK, and may transmit the data clock signal DCK to the S2P conversion unit 522. The S2P conversion unit 522 (a serial/parallel conversion unit 522) may convert a portion where a data signal is inserted in the interface signal IS into parallel data through the data clock signal DCK, thereby recovering the data DT.

When the data transmission device 510 is included in the data processing device described with reference to FIG. 4 and the data reception device 520 is included in the data driving device described with reference to FIG. 4, the data DT may include the image data or the data control signal.

When the data transmission 510 is included in the data driving device described with reference to FIG. 4 and the data reception device 520 is included in the data processing device described with reference to FIG. 4, the data DT may be the sensing data for pixels.

Figure 6:
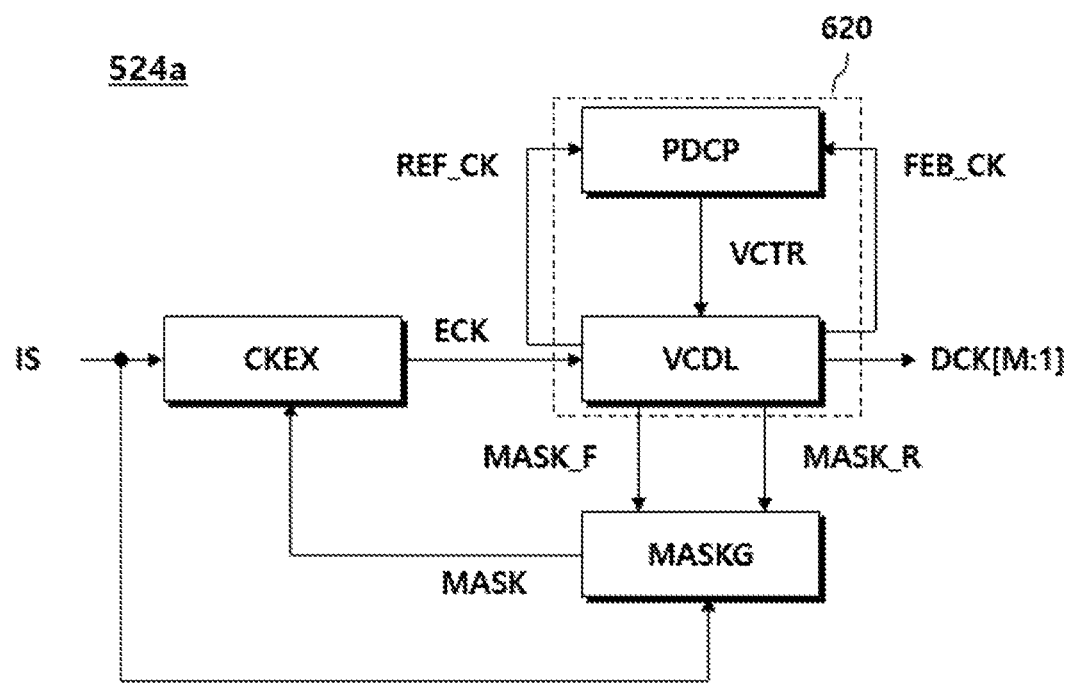
FIG. 6 is a first exemplary configuration diagram illustrating a clock recovery unit according to an embodiment.

FIG. 6 is a first exemplary configuration diagram illustrating a clock recovery unit according to an embodiment.

Referring to FIG. 6, a clock recovery unit 524*a* may include a clock extraction unit CKEX, a mask signal generation unit MASKG, and a time-delay control unit 620.

The mask signal generation unit MASKG may generate a mask signal MASK in accordance with a mask rising signal MASK_R. The mask signal generation unit MASKG may form the rising edge of the mask signal MASK in accordance with the mask rising signal MASK_R.

The mask signal generation unit MASKG may generate the mask signal MASK in accordance with a mask falling signal MASK_F. The mask signal generation unit MASKG may form the falling edge of the mask signal MASK in accordance with the mask falling signal MASK_F.

The mask signal generation unit MASKG may include an internal circuit including at least one logic circuit, and may form the rising edge of the mask signal MASK in accordance with the mask rising signal MASK_R through the internal circuit. At this time, a processing delay time of the internal circuit may occur. In accordance with the processing delay time, a predetermined time difference may occur between the mask rising signal MASK_R and the rising edge of the mask signal MASK.

Meanwhile, the mask signal MASK may be transmitted to the clock extraction unit CKEX. The clock extraction unit CKEX may generate an extraction clock ECK through a signal at a time interval indicated by the mask signal MASK in the interface signal IS in which a clock signal is embedded.

The time-delay control unit 620 may generate the plurality of data clock signals DCK[M:1], the mask rising signal MASK_R, and the mask falling signal MASK_F by time-delaying the extraction clock ECK.

The time-delay control unit 620 may include a voltage control delay line unit VCDL and a phase difference feedback unit PDCP.

The voltage control delay line unit VCDL may include a delay circuit composed of a plurality of delay means connected in series. Such a delay means may generate a plurality of data clock signals DCK having different phases by time-delaying the extraction clock ECK. Such a delay circuit may adjust the degree of time delay of each delay means in accordance with the voltage control signal VCTR.

The phase difference feedback unit PDCP may generate a signal corresponding to a phase difference between a feedback clock FEB_CK and a reference clock REF_CK as the voltage control signal VCTR. The phase difference feedback unit PDCP may output the voltage control signal VCTR to the respective delay means included in the delay circuit.

The feedback clock FEB_CK may be one data clock signal generated by the voltage control delay line unit VCDL. The reference clock REF_CK may be another data clock signal through a predetermined number of delay means in this one data clock signal.

For example, one period of the interface signal IS may be divided into N unit times (N is a natural number equal to or greater than 2) in which information is divided. The reference clock REF_CK may be a data clock signal generated by time-delaying the feedback clock FEB_CK by N unit times. At this time, if the phases of the reference clock REF_CK and the feedback clock FEB_CK coincide with each other, the unit time determined by the data reception device matches the unit time intended by the data transmission device.

Figure 7:
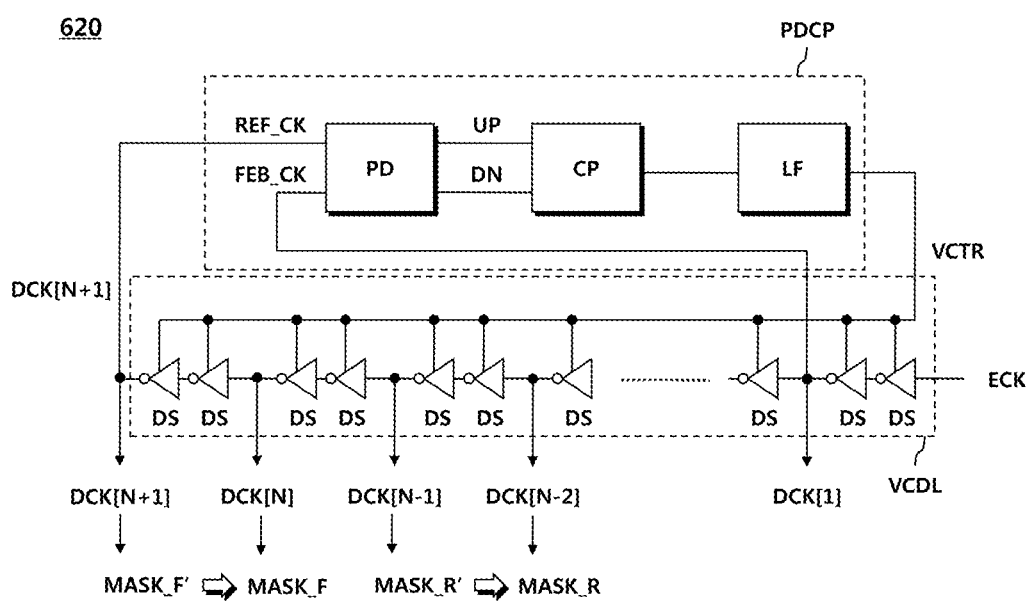
FIG. 7 is a configuration diagram illustrating a time-delay control unit according to an embodiment.

FIG. 7 is a configuration diagram illustrating a time-delay control unit according to an embodiment.

Referring to FIG. 7, the time-delay control unit 620 may include a voltage control delay line unit VCDL and a phase difference feedback unit PDCP.

The voltage control delay line unit VCDL may include a plurality of delay means DS. Each delay means DS may be an inverter accompanied by a time delay, and two delay means DS may take charge of a time delay by one unit time.

The voltage control delay line unit VCDL may generate a plurality of data clock signals (DCK [N:1]) using the plurality of delay means DS.

The voltage control delay line unit VCDL may output one data clock signal among the plurality of data clock signals (DCK [N:1]) as a feedback clock FEB_CK, and may output another data clock signal as a reference clock REF_CK. When one period of the interface signal is divided into N unit times, the reference clock REF_CK may be a clock obtained by time-delaying the feedback clock FEB_CK by the N unit times.

The phase difference feedback unit PDCP may include a phase detector PD, a charge pump CP, and a loop filter LF.

The phase detector PD may selectively output an up signal UP and a down signal DN to correspond to a phase difference between the feedback clock FEB_CK and the reference clock REF_CK. The charge pump CP may generate an output voltage to correspond to the up signal UP and the down signal DN, and the loop filter LF may generate the voltage control signal VCTR according to the output voltage of the charge pump CP.

The voltage control signal VCTR may be a driving voltage of the delay means DS. At this time, when the voltage of the voltage control signal VCTR is high, the current of the delay means DS may increase to decrease the time delay of the delay means DS. Conversely, when the voltage of the voltage control signal VCTR is low, the current of the delay means DS may decrease to increase the time delay of the delay means DS.

The voltage control delay line unit VCDL may output the mask rising signal MASK_R and the mask falling signal MASK_F together with the data clock signal DCK.

The mask rising signal MASK_R may be a signal whose phase is made earlier by one to two unit times than the conventional mask rising signal MASK_R'. The mask falling signal MASK_F may be a signal whose phase is made earlier by one to two unit times than the conventional mask falling signal MASK_F'.

Figure 8:
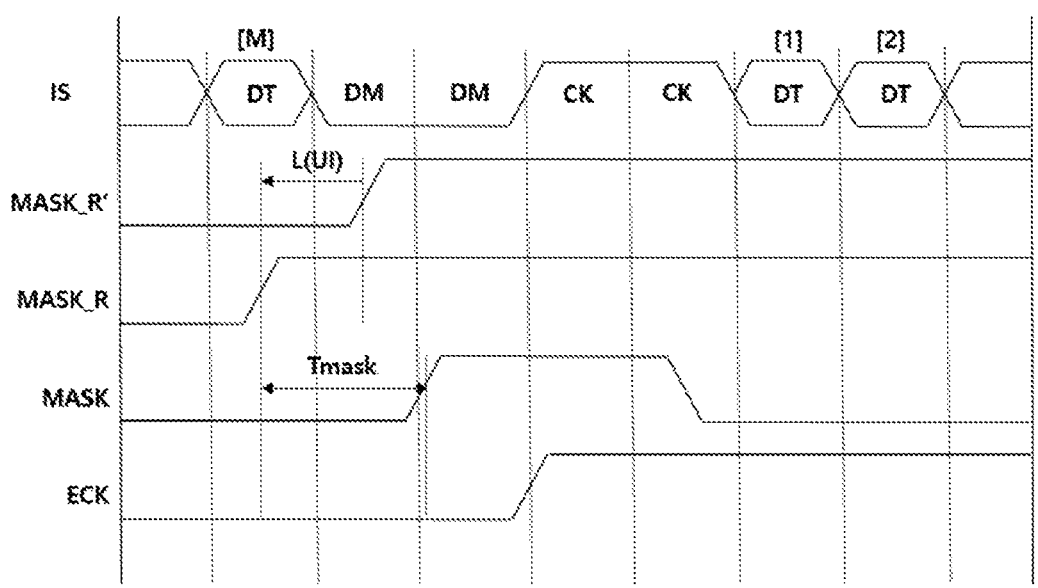
FIG. 8 is a first exemplary timing diagram illustrating a main signal in a clock recovery unit according to an embodiment.

FIG. 8 is a first exemplary timing diagram illustrating a main signal in a clock recovery unit according to an embodiment.

Referring to FIG. 8, one period of an interface signal IS may be divided into a plurality of unit times UI in which information is divided. Each unit time UI can indicate each bit of data for a data signal DT. The data signal DT having M bits (M is a natural number of 2 or more) may be included in each period of the interface signal IS. A dummy signal DM interval may be arranged subsequent to the data signal DT and a clock signal CK interval may be arranged subsequent to the dummy signal DM interval.

The dummy signal DM is a portion other than the data signal DT or the clock signal CK, and may be inserted to maintain a space between the data signal DT and the clock signal CK or may be inserted as a preliminary section for expansion of the data signal DT. The dummy signal DM interval may correspond to one unit time or two unit times as shown in FIG. 8.

In one embodiment, the rising edge of the mask signal MASK be formed in the dummy signal DM interval and the falling edge of the mask signal MASK be formed in the clock signal CK interval. The mask signal generation unit may generate a mask rising signal MASK_R in consideration of a processing delay time Tmask.

In order to reflect an increase in the processing delay time Tmask based on the unit time UI, the phase of the mask rising signal MASK_R may be ahead of the phase of the conventional mask rising signal MASK_R' by L (L is a positive number and a multiple of 0.5) unit times UI. The phase of the mask rising signal MASK_R may be ahead of the phase of the extraction clock ECK by K (K is a positive number and a multiple of 0.5) unit times with respect to the extraction clock ECK.

Meanwhile, as the phase of the mask rising signal MASK_R is made earlier, a time point indicated by the mask rising signal MASK_R—for example, when the signal level of the mask rising signal MASK_R transits—may correspond to the data signal DT interval. For example, the time point indicated by the mask rising signal MASK_R may correspond to the last data signal (DT[M]) interval. At this time, if the processing delay time Tmask is equal to or longer than a predetermined time, the rising edge of the mask signal MASK generated in accordance with the mask rising signal MASK_R may correspond to the dummy signal DM interval. However, if the processing delay time Tmask becomes shorter than expected due to the deviation in the product or the like, there may arise a problem that the rising edge of the mask signal MASK may be formed in the data signal DT interval other than the dummy signal DM interval.

Figure 9:
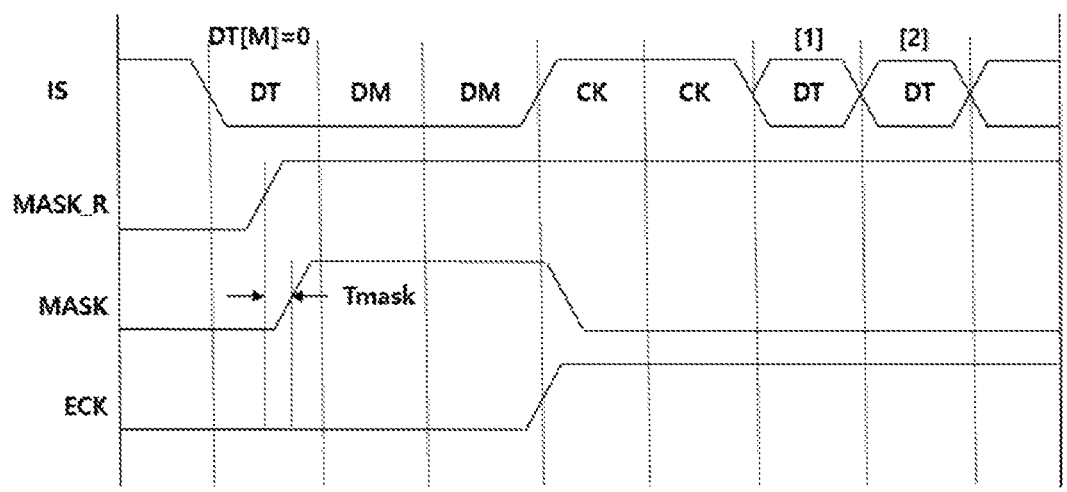
FIG. 9 is a first exemplary timing diagram illustrating a main signal when a mask signal is formed in a data signal interval.

FIG. 9 is a first exemplary timing diagram illustrating a main signal when a mask signal is formed in a data signal interval.

Referring to FIG. 9, the mask rising signal MASK_R may be formed in the data signal DT interval. In particular, the mask rising signal MASK_R may be formed in the last data signal (DT[M]) interval. When the processing delay time Tmask is short, some intervals of the mask signal MASK generated in accordance with the mask rising signal MASK_R (a partial interval having a high level) may overlap the data signal DT interval, particularly, the last data signal (DT[M]) interval.

The clock extraction unit may generate an extraction clock ECK at a time point when an interface signal IS has a high level in a time interval indicated by the mask signal MASK. In the dummy signal DM interval, the interface signal IS may indicate a first level, for example, a low level, and in the clock signal CK interval, the interface signal IS may indicate a second level, for example, a high level. If the time interval indicated by the mask signal MASK extends over the dummy signal DM interval and the clock signal CK interval, the clock extraction unit may generate the extraction clock ECK to correspond to a time point when the interface signal IS is shifted from the dummy signal DM interval to the clock signal CK interval.

Meanwhile, in a case in which a partial interval of the mask signal MASK overlaps the data signal DT, when the data signal DT indicates the first level, for example, the low level in the overlapping interval, the clock extraction unit may normally generate the extraction clock ECK in the clock signal CK interval in which the second level appears. For example, if a partial interval of the mask signal MASK overlaps the last data signal (DT[M]) interval and the last data signal (DT[M]) indicates the first level (e.g., the value of the last data bit is 0), the clock extraction unit may normally generate the extraction clock ECK in the clock signal CK interval in which the second level appears.

Figure 10:
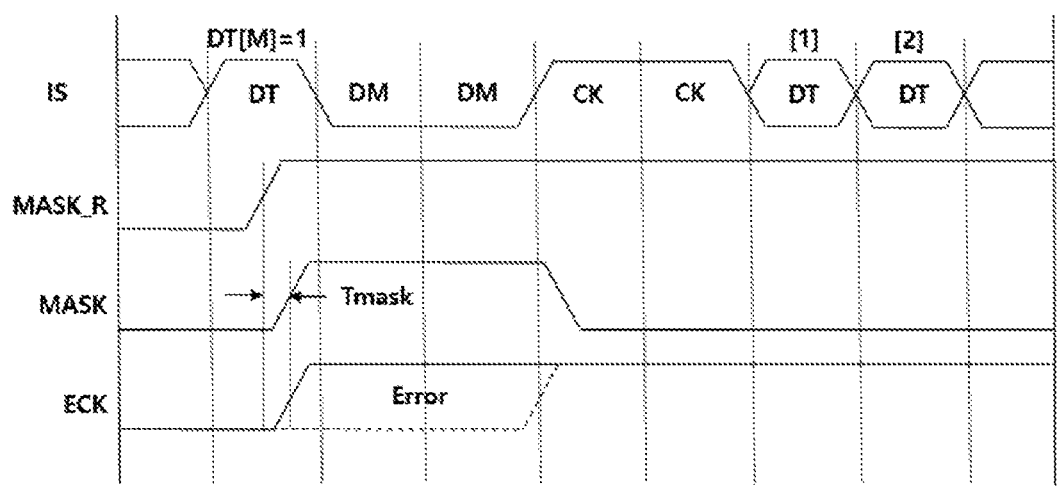
FIG. 10 is a second exemplary timing diagram illustrating a main signal when a mask signal is formed in a data signal interval.

FIG. 10 is a second exemplary timing diagram illustrating a main signal when a mask signal is formed in a data signal interval.

Compared to FIG. 9, in the timing diagram of FIG. 10, the last data signal (DT[M]) overlapping the mask signal MASK indicates a second level (e.g., a high level).

The clock extraction unit may generate the extraction clock ECK at a time point when an interface signal IS has a second level in a time interval indicated by the mask signal MASK. However, since the last data signal (DT[M]) indicates the second level (e.g., the value of the last data bit is 1) in the time interval indicated by the mask signal MASK, the clock extraction unit may generate the extraction clock ECK in synchronization with the data signal DT according to the value.

In order to solve the these problems, the mask signal generation unit may monitor the interface signal IS at the time point indicated by the mask rising signal MASK_R, may form the rising edge of the mask signal MASK in accordance with the mask rising signal MASK_R when the interface signal IS indicates the first level, and may form the rising edge of the mask signal MASK in accordance with a signal for shifting the interface signal IS from the second level to the first level when the interface signal IS indicates the second level different from the first level at the time point indicated by the mask rising signal MASK_R.

Figure 11:
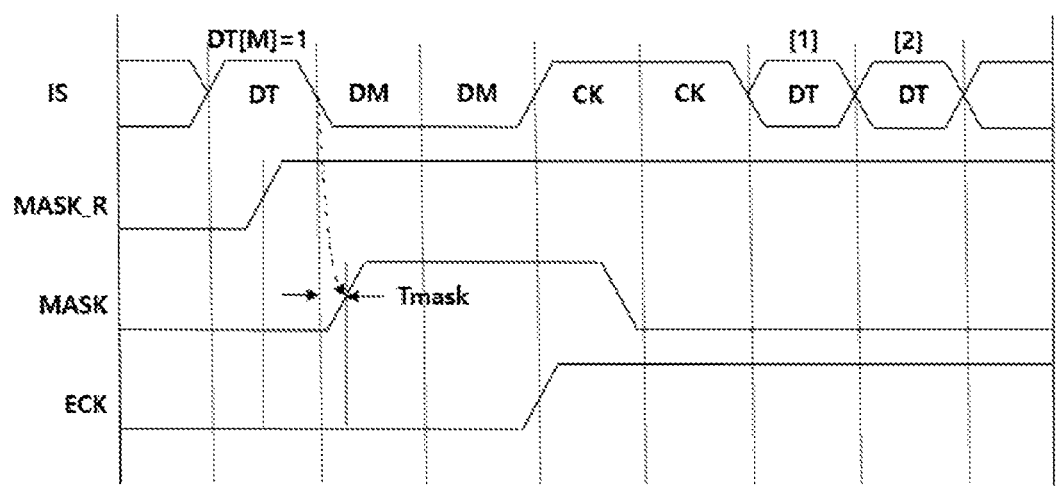
FIG. 11 is a second exemplary timing diagram illustrating a main signal in a clock recovery unit according to an embodiment.

FIG. 11 is a second exemplary timing diagram illustrating a main signal in a clock recovery unit according to an embodiment.

Referring to FIG. 11, the mask signal generation unit may form the rising edge of a mask signal MASK in accordance with a mask rising signal MASK_R when an interface signal IS indicates a first level in a time point indicated by the mask rising signal MASK_R, and may form the rising edge of the mask signal MASK in accordance with a signal for shifting the interface signal IS from a second level to the first level when the interface signal IS indicates the second level different from the first level at the time point indicated by the mask rising signal MASK_R.

The interface signal IS may include a dummy signal DM interval and a clock signal CK interval that are continuously arranged, and the phase of the mask rising signal MASK_R may be ahead of the dummy signal DM interval. The data signal DT interval may be ahead of the dummy signal DM interval. Accordingly, the mask rising signal MASK_R may correspond to the dummy signal DT interval. In particular, the mask rising signal MASK_R may be formed to correspond to the last data signal (DT[M]) interval.

A time (that is, a processing delay time Tmask) during which the mask signal generation unit generates the rising edge of the mask signal MASK may be shorter than 0.5 unit times.

When the dummy signal DM interval corresponds to two unit times, the phase of the mask rising signal MASK_R may be formed to be ahead of the phase of the extraction clock ECK by 2.5 unit times. At this time, when the processing delay time Tmask of the mask signal generation unit is smaller than 0.5 unit times, the rising edge of the mask signal MASK may be arranged in the data signal DT interval.

When the dummy signal DM interval corresponds to one unit time, the phase of the mask rising signal MASK_R may be formed to be ahead of the phase of the extraction clock ECK by 1.5 unit times. At this time, the processing delay time Tmask of the mask signal generation unit is smaller than 0.5 unit times, the rising edge of the mask signal MASK may be arranged in the data signal DT interval.

Meanwhile, when the data signal DT indicates a first level (e.g., a low level and 0 as a bit value) at a time point indicated by the mask rising signal MASK_R while monitoring the interface signal IS together with the mask rising signal MASK_R, the mask signal generation unit may generate the mask signal MASK in accordance with the mask rising signal MASK_R When the data signal DT indicates a second level (e.g., a high level and 1 as a bit value) at the time point indicated by the mask rising signal MASK_R, the mask signal generation unit may generate the mask signal MASK in accordance with a signal shifted from the second level to the first level in the falling edge of the data signal DT (e.g., the data signal DT).

According to this control, a problem of overlapping the mask signal MASK with the data signal DT of the second level, for example, the high level, does not occur.

Meanwhile, the mask falling signal may be generated in conjunction with the mask rising signal. However, if the mask falling signal is made much earlier together with the mask rising signal, there arises a problem that the mask falling signal is located in the dummy signal interval and even the falling edge of the mask signal in accordance with the mask falling signal is located in the dummy signal interval.

The second example described with reference to FIG. 12 can solve the above-described problem by generating the falling edge of the mask signal in accordance with the extraction clock other than a separate mask falling signal.

Figure 12:
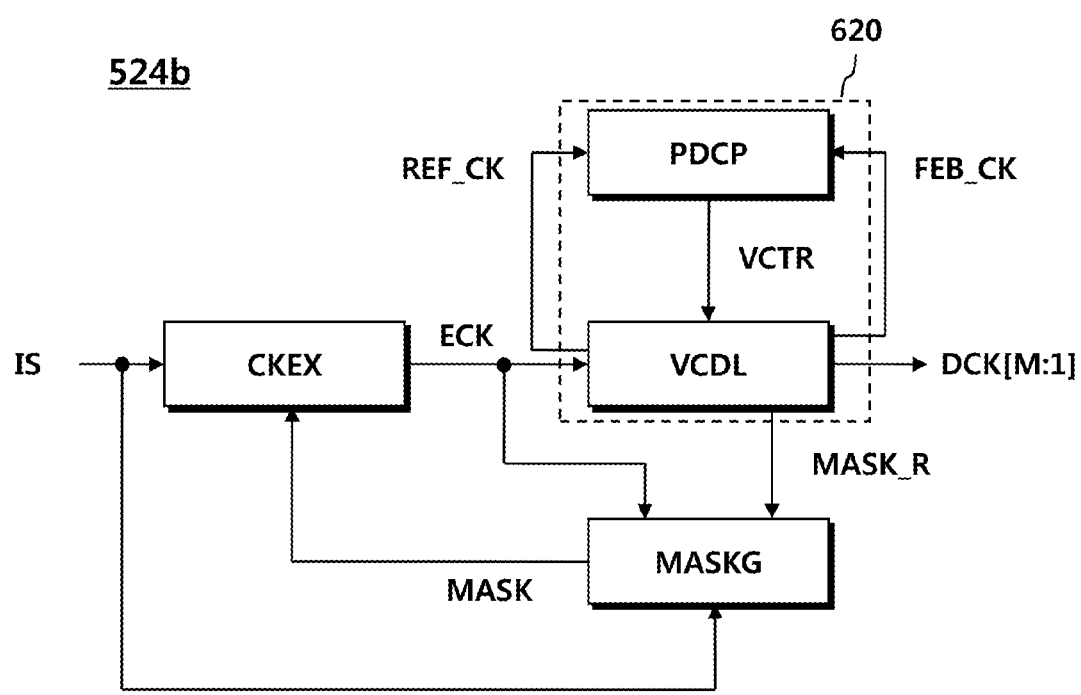
FIG. 12 is a second exemplary configuration diagram illustrating a clock recovery unit according to an embodiment.

FIG. 12 is a second exemplary configuration diagram illustrating a clock recovery unit according to an embodiment.

Referring to FIG. 12, the clock recovery unit 524b may include a clock extraction unit CKEX, a mask signal generation unit MASKG, and a time-delay control unit 620.

The mask signal generation unit MASKG may generate a mask signal MASK in accordance with a mask rising signal MASK_R. The mask signal generation unit MASKG may form the rising edge of the mask signal MASK in accordance with the mask rising signal MASK_R.

The mask signal generation unit MASKG may generate the mask signal MASK in accordance with the extraction clock ECK. The mask signal generation unit MASKG may form the falling edge of the mask signal MASK in accordance with the extraction clock ECK. Alternatively, the mask signal generation unit MASKG may generate the mask signal MASK in accordance with a signal obtained by delaying the extraction clock ECK for a predetermined time. The mask signal generation unit MASKG may form the falling edge of the mask signal MASK in accordance with the signal obtained by delaying the extraction clock ECK for a predetermined time.

The mask signal generation unit MASKG may form the rising edge of the mask signal MASK in accordance with the mask rising signal MASK_R through a first internal circuit while including the first internal circuit including at least one logic circuit. At this time, a processing delay time of the first internal circuit may occur. According to such a processing delay time, a difference of a predetermined time between the mask rising signal MASK_R and the rising edge of the mask signal MASK may occur.

The mask signal generation unit MASKG may form the falling edge of the mask signal MASK in accordance with the extraction clock ECK through a second internal circuit while including the second internal circuit including at least one logic circuit. At this time, a processing delay time of the second internal circuit may occur. According to such a processing delay time, a difference of a predetermined time between the extraction clock ECK and the falling edge of the mask signal MASK may occur.

The processing delay time between the mask rising signal MASK_R and the rising edge of the mask signal MASK may be within 0.5 unit times, and the processing delay time between the extraction clock ECK and the falling edge of the mask signal MASK may be within 0.5 unit times.

When the mask falling signal is located in the dummy signal interval and the processing delay time required to generate the falling edge of the mask signal MASK using the mask falling signal is within 0.5 unit times, a time interval indicated by the mask signal MASK may be included in the dummy signal interval, whereby the clock extraction unit may not extract the clock signal from the interface signal IS.

On the other hand, when the mask signal generation device generates the falling edge of the mask signal MASK in accordance with the extraction clock ECK, the mask signal MASK overlaps the clock signal interval at least by the above-mentioned processing delay time.

Figure 13:
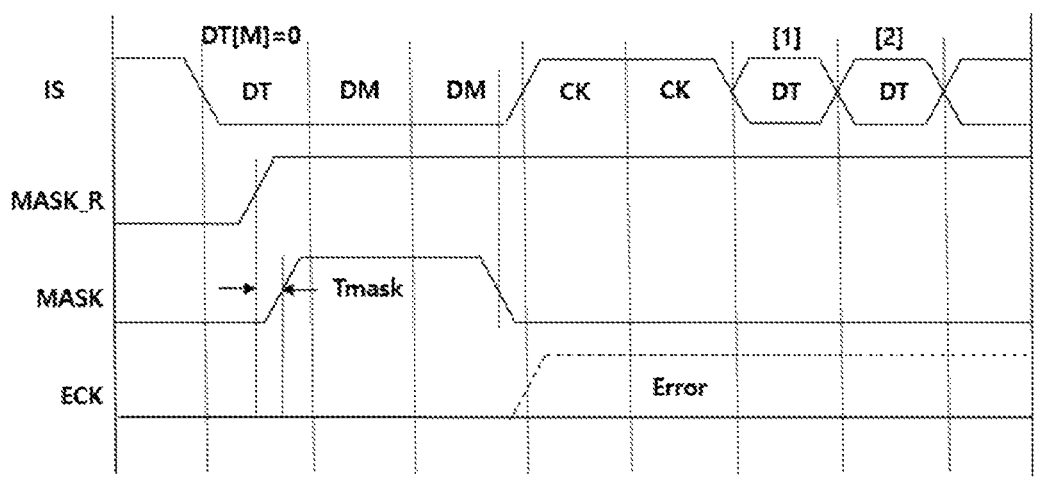
FIG. 13 is a third exemplary timing diagram illustrating a main signal when a mask signal is formed in a data signal interval.

FIG. 13 is a third exemplary timing diagram illustrating a main signal when a mask signal is formed in a data signal interval.

Referring to FIG. 13, a mask rising signal MASK_R may be formed in a data signal DT interval. In particular, the mask rising signal MASK_R may be formed in the last data signal (DT[M]). When a processing delay time Tmask is short, a partial interval of the mask signal MASK generated in accordance with the mask rising signal MASK_R (e.g., a partial interval having a high level) may overlap the data signal DT interval, in particular, the last data signal (DT[M]) interval.

The mask signal MASK may have the same high level interval as that of the dummy signal interval. Under such a condition, when the rising edge of the mask signal MASK is located in the data signal DT interval, the falling edge of the mask signal MASK is located in the dummy signal DM interval.

Since the clock extraction unit that receives such a mask signal MASK does not recognize that the interface signal IS indicates a second level (e.g., a high level) in a time interval indicated by the mask signal MASK, the clock extraction unit may fail to generate the extraction clock ECK.

Figure 14:
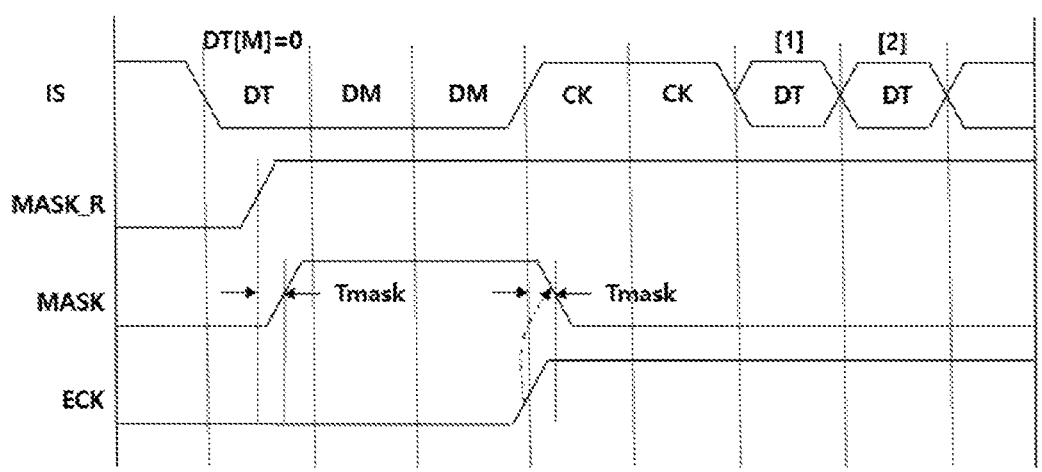
FIG. 14 is a third exemplary timing diagram illustrating a main signal in a clock recovery unit according to an embodiment.

FIG. 14 is a third exemplary timing diagram illustrating a main signal in a clock recovery unit according to an embodiment.

Referring to FIG. 14, the mask signal generation unit may form the rising edge of a mask signal MASK in accordance with a mask rising signal MASK_R. At this time, the mask rising signal MASK_R may be located in a data signal DT interval, and even the rising edge of the mask signal MASK may be located in the data signal DT interval because a processing delay time Tmask is short.

The mask signal generation unit may form the falling edge of the mask signal MASK in accordance with an extraction clock ECK or a signal obtained by delaying the extraction clock ECK for a predetermined time. When the mask signal generation unit generates the falling edge of the mask signal MASK in accordance with the extraction clock ECK, the phase of the falling edge of the mask signal MASK may appear to be delayed with respect to the phase of the extraction clock ECK by the processing delay time Tmask.

Figure 15:
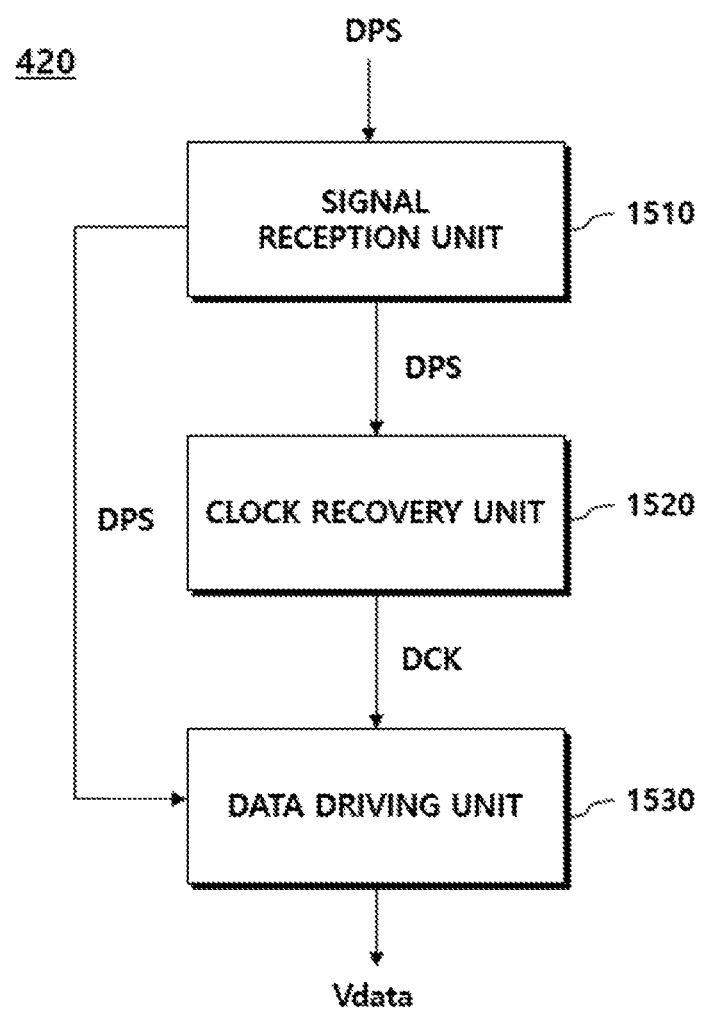
FIG. 15 is a configuration diagram illustrating a data driving device according to an embodiment.

FIG. 15 is a configuration diagram illustrating a data driving device according to an embodiment.

Referring to FIG. 15, the data driving device 420 may include a signal reception unit 1510, a clock recovery unit 1520, and a data driving unit 1530.

The signal reception unit 1510 may receive a display signal DPS with a clock signal embedded therein from the data processing device. The display signal DPS is a sort of the interface signal and includes a data control signal, image data, and the like as data, and the clock signal may be embedded in the display signal DPS.

The clock recovery unit 1520 may recover the clock signal from the display signal DPS to generate a plurality of data clock signals DCK.

The data driving unit 1530 may extract image data from the display signal DPS in accordance with the plurality of data clock signals DCK, and may generate a data voltage Vdata in accordance with the image data to drive pixels disposed on a panel.

The clock recovery unit 1520 may generate an extraction clock through a time interval indicated by a mask signal in the display signal DPS, may generate the plurality of data clock signals and the mask signal using the extraction clock. The phase of the mask signal may be changed in accordance with the level of the last data bit in a signal interval of the display signal. For example, the phase of the mask signal when the last data bit is 0 may be ahead of the phase of the mask signal when the last data bit is 1.

The clock recovery unit may generate a mask rising signal for forming the rising edge of the mask signal, and the mask rising signal may be generated in the signal interval of the last data bit.

The clock recovery unit may form the rising edge of the mask signal in accordance with the mask rising signal when the last data bit is a first level, and may form the rising edge of the mask signal in accordance with a time in which the signal interval of the last data bit is terminated when the last data bit is a second level different from the first level.

In the display signal, the dummy signal interval may appear subsequent to the last data bit.

The clock recovery unit may generate the falling edge of the mask signal in accordance with the extraction clock or may generate the falling edge of the mask signal in accordance with a signal obtained by delaying the extraction clock for a predetermined time.

The display signal may be a serial signal, and the data driving unit may include a serial/parallel conversion unit that converts a portion for image data in the display signal into parallel data.

As described above, according to embodiments, the clock signal can be accurately recovered from the interface signal. As an example, according to embodiments, it is possible to accurately recover the clock signal from the interface signal by allowing a mask signal to accurately indicate a portion into which the clock signal is inserted in the interface signal with the clock signal embedded therein. As another example, according to the embodiments, it is possible to generate a mask signal by compensating for a processing delay time generated in the mask signal generation circuit, thereby reducing the inaccuracy of the mask signal due to the processing delay time. As another example, according to the embodiments, it is possible to solve a problem that the clock signal is erroneously recovered due to the data signal appearing in the time interval indicated by the mask signal. As another example, according to the embodiments, it is possible to solve a problem that the clock signal is not recovered because the clock signal is not included in the time interval indicated by the mask signal.

Since terms, such as "including," "comprising," and "having" mean that corresponding elements may exist unless they are specifically described to the contrary, it shall be construed that other elements can be additionally included, rather than that such elements are omitted. All technical, scientific or other terms are used consistently with the meanings as understood by a person skilled in the art unless defined to the contrary. Common terms as found in dictionaries should be interpreted in the context of the related technical writings, rather than overly ideally or impractically, unless the present disclosure expressly defines them so.

Although a preferred embodiment of the present disclosure has been described for illustrative purposes, those skilled in the art will appreciate that various modifications, additions and substitutions are possible, without departing from the scope and spirit of the embodiment as disclosed in the accompanying claims. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A clock recovery device comprising:
   a mask signal generation unit configured to form a rising edge of a mask signal in accordance with a mask rising signal when a last data bit in a period of an interface signal is a first level, and to form the rising edge of the mask signal in accordance with a time in which a signal interval of the last data bit is terminated when the last data bit is a second level different from the first level;
   a clock extraction unit configured to generate an extraction clock from the interface signal with a clock signal embedded therein in a time interval in which the mask signal is activated; and
   a time-delay control unit configured to generate a plurality of data clock signals and the mask rising signal in a next period by time-delaying the extraction clock, wherein the mask rising signal is generated in the signal interval of the last data bit.

2. The clock recovery device of claim 1, wherein one period of the interface signal is divided into a plurality of unit times, each including divided information, and a phase of the mask rising signal is ahead of a phase of the extraction clock by K unit times, wherein K is a positive number and a multiple of 0.5.

3. The clock recovery device of claim 1, wherein the interface signal includes a dummy signal interval and a clock signal interval, and the interface signal indicates the first level in the dummy signal interval and indicates the second level in the clock signal interval.

4. The clock recovery device of claim 3, wherein a phase of the mask rising signal is ahead of a phase of the dummy signal interval.

5. The clock recovery device of claim 1, wherein the mask signal generation unit generates a falling edge of the mask signal in accordance with the extraction clock or a signal obtained by delaying the extraction clock for a predetermined time.

6. The clock recovery device of claim 1, wherein the time-delay control unit comprises
a delay circuit configured to generate a plurality of data clock signals respectively having different phases by time-delaying the extraction clock through a plurality of delay means connected in serial and to adjust a degree of time delay of each delay means in accordance with a voltage control signal, and
a phase difference feedback unit configured to generate the voltage control signal corresponding to a phase difference between one data clock signal and another data clock signal obtained by the one data clock signal passing a predetermined number of delay means to output the voltage control signal to each delay means.

7. The clock recovery device of claim 6, wherein one period of the interface signal is divided into a plurality of unit times, each including divided information, and each delay means delays the time by 0.5 unit times.

8. A source driver comprising:
a signal reception unit configured to receive a display signal with a clock signal embedded therein;
a clock recovery unit configured to generate a plurality of data clock signals by recovering the clock signal from the display signal; and
a data driving unit configured to extract image data from the display signal in accordance with the plurality of data clock signals and to drive pixels disposed on a panel in accordance with the image data,
wherein the clock recovery unit generates an extraction clock from the display signal in a time interval in which a mask signal is activated and generates the plurality of data clock signals and the mask signal using the extraction clock, and a phase of the mask signal is controlled in accordance with a level of a last data bit in a period of the display signal,
wherein the clock recovery unit generates a mask rising signal for forming a rising edge of the mask signal, and the mask rising signal is generated in a signal interval of the last data bit,
wherein the clock recovery unit forms the rising edge of the mask signal in accordance with the mask rising signal when the last data bit is a first level, and forms the rising edge of the mask signal in accordance with a time in which the signal interval of the last data bit is terminated when the last data bit is a second level different from the first level.

9. The source driver of claim 8, wherein a dummy signal interval appears subsequent to the last data bit in the display signal.

10. The source driver of claim 8, wherein the clock recovery unit generates a falling edge of the mask signal in accordance with the extraction clock or a signal obtained by delaying the extraction clock for a predetermined time.

11. The source driver of claim 8, wherein the display signal is a serial signal, and the data driving unit comprises a serial/parallel conversion unit configured to convert a portion for the image data in the display signal into parallel data.

* * * * *